US012644179B2

(12) United States Patent
Cho et al.

(10) Patent No.: US 12,644,179 B2
(45) Date of Patent: Jun. 2, 2026

(54) APPARATUS FOR COLLECTING REACTION BY-PRODUCTS FOR SEMICONDUCTOR PROCESSES THROUGH PYROLYSIS IN THE HIGH TEMPERATURE REGION AND OXIDATION REACTION IN THE LOW TEMPERATURE REGION

(71) Applicant: MILAEBO CO., LTD., Pyeongtaek-si (KR)

(72) Inventors: Che Hoo Cho, Seoul (KR); Yeon Ju Lee, Hwaseong-si (KR); Ji Eun Han, Pyeongtaek-si (KR); Sung Won Yoon, Siheung-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 535 days.

(21) Appl. No.: 18/459,754

(22) Filed: Sep. 1, 2023

(65) Prior Publication Data

US 2024/0425980 A1      Dec. 26, 2024

(30) Foreign Application Priority Data

Jun. 21, 2023    (KR) ........................ 10-2023-0079396

(51) Int. Cl.
| | |
|---|---|
| *C23C 16/44* | (2006.01) |
| *F23J 15/02* | (2006.01) |
| *H10P 72/00* | (2026.01) |

(52) U.S. Cl.
CPC ...... *C23C 16/4412* (2013.01); *C23C 16/4411* (2013.01); *F23J 15/022* (2013.01); *H10P 72/0402* (2026.01)

(58) Field of Classification Search
CPC . C23C 16/4412; C23C 16/4411; F23J 15/022; H10P 72/0402; B01D 53/002;
(Continued)

(56) References Cited

U.S. PATENT DOCUMENTS

| | | | |
|---|---|---|---|
| 2003/0101938 A1* | 6/2003 | Ronsse ................. | C23C 16/407 |
| | | | 118/712 |
| 2021/0134621 A1* | 5/2021 | Cho .................... | H10P 72/0402 |

(Continued)

FOREIGN PATENT DOCUMENTS

| | | | | |
|---|---|---|---|---|
| JP | 2020088369 A | * | 6/2020 | ......... H10P 72/0402 |
| JP | 2021-62329 A | | 4/2021 | |

(Continued)

*Primary Examiner* — Jeffrie R Lund
(74) *Attorney, Agent, or Firm* — You & IP, LLC

(57) ABSTRACT

The present disclosure relates to an apparatus for collecting reaction by-products for semiconductor processes through pyrolysis in a high-temperature region and an oxidation reaction in a low-temperature region, and an object of the present disclosure is to provide an apparatus for collecting reaction by-products, which is capable of collecting powdered oxides grown from High K materials by inducing an oxidation reaction in a box-shaped collection part having a low-temperature region formed by a cooling pad part after thermally decomposing the High K material at a high temperature of a heater in an inlet port of the collection apparatus when High K deposition precursors, which are supplied to a process chamber for an oxidation process for depositing a semiconductor dielectric film with the High K material having high permittivity in order to miniaturize a semiconductor circuit, are discharged together with exhaust gas.

13 Claims, 6 Drawing Sheets

(58) Field of Classification Search
CPC ............... B01D 46/10; B01D 46/4227; B01D
2258/0216; B01J 19/0006; B01J 19/0013
See application file for complete search history.

(56) References Cited

U.S. PATENT DOCUMENTS

| 2022/0203290 | A1* | 6/2022 | Gim | .................. B01D 53/0407 |
| 2024/0425980 | A1* | 12/2024 | Cho | .................. C23C 16/4412 |

FOREIGN PATENT DOCUMENTS

| KR | 10-2000-0024456 | A | | 5/2000 | |
| KR | 10-1117098 | B1 | | 3/2012 | |
| KR | 10-1806480 | B1 | | 1/2018 | |
| KR | 10-2019-0078939 | A | | 7/2019 | |
| KR | 10-2154196 | B1 | | 9/2020 | |
| KR | 10-2228180 | B1 | | 3/2021 | |
| KR | 10-2311930 | B1 | | 10/2021 | |
| KR | 10-2316922 | B1 | | 10/2021 | |
| KR | 102800969 | B1 | * | 4/2025 | ....... H01L 21/67103 |

* cited by examiner

APPARATUS FOR COLLECTING REACTION BY-PRODUCTS FOR SEMICONDUCTOR PROCESSES THROUGH PYROLYSIS IN THE HIGH TEMPERATURE REGION AND OXIDATION REACTION IN THE LOW TEMPERATURE REGION

CROSS-REFERENCE TO RELATED APPLICATIONS

This application claims the priority of Korean Patent Application No. 10-2023-0079396 filed on Jun. 21, 2023, in the Korean Intellectual Property Office, the disclosure of which is incorporated herein by reference.

BACKGROUND

Field

The present disclosure relates to an apparatus for collecting reaction by-products for semiconductor processes through pyrolysis in a high-temperature region and an oxidation reaction in a low-temperature region, and more particularly, to an apparatus for collecting reaction by-products that collects High K (dielectric constant) materials contained in High K deposition precursors through pyrolysis and oxidation reactions when the High K deposition precursors, which are supplied to a process chamber for an oxidation process for depositing a semiconductor insulation film with the High K material to miniaturize a semiconductor circuit, are contained in exhaust gas and discharged after a deposition process.

Description of the Related Art

In general, semiconductor manufacturing processes broadly include a pre-process (fabrication process) and a post-process (assembly process). The pre-process refers to a process of manufacturing semiconductor chips by processing specific patterns by repeatedly performing a procedure of depositing thin films on wafers in various types of process chambers and a procedure of selectively etching the deposited thin films. The post-process refers to a process of individually separating the chips manufactured in the pre-process and then assembling finished products by combining the chips and lead frames.

In this case, the process of depositing a thin-film on the wafer or the process of etching the thin-film deposited on the wafer is performed at a high temperature by injecting various semiconductor depositing and etching precursors and reactant gases into a process chamber through a gas injection system. During the process, various types of ignitable gases, corrosive foreign substances, and harmful gases containing toxic components are produced in large amount in the process chamber.

In order to purify and discharge the harmful gas, a scrubber is installed at a rear end of a vacuum pump that establishes a vacuum state in a semiconductor manufacturing process chamber, and the scrubber purifies exhaust gas discharged from the process chamber and discharges the purified gas into the atmosphere.

However, because the scrubber mainly purifies and treats only gaseous by-products, the by-product may adhere to an exhaust line when the by-product, which is discharged to the outside of the process chamber, is solidified. For this reason, there may occur problems in that exhaust pressure increases, a vacuum pump is broken down at the time of introducing the by-product by using the vacuum pump, and harmful gas reversely flows into the process chamber and contaminates a wafer.

Therefore, in most semiconductor manufacturing facilities, an apparatus for collecting by-products is installed between the process chamber and the vacuum pump to aggregate exhaust gas and collect the exhaust gas in a powder or solidified material state.

Meanwhile, recently, in order to solve problems of a leak of an electric current from a semiconductor insulation film caused by the further increase in degree of semiconductor integration and the miniaturization of the semiconductor circuit, the precursors, which are supplied to the process chamber to perform a process of depositing a gate oxide film or a capacitor oxide film, tend to gradually change from $SiO_2$ deposition precursors in the related art to High K material (e.g., $Al_2O_3$, $HfO_2$, or $ZrO_2$) deposition precursors having high permittivity.

Therefore, in order to prevent a breakdown of the vacuum pump, it is necessary to collect and then discharge the High K material that is a solid-phase material contained in exhaust gas that contains precursors and is discharged.

However, a general collection apparatus in the related art, which collects the solid-phase material, is structured to perform a collection process of raising a temperature of exhaust gas by using a heater to prevent exhaust gas from being mainly collected in an inlet port and clogging the inlet port, or a general collection apparatus in the related art is structured to perform a collection process of agglomerating and collecting solid-phase reaction by-products on a collection plate surface of an internal collection device after introducing exhaust gas, which does not clog the inlet port, without heating the exhaust gas. For this reason, the collection apparatuses have a structural problem in that it is difficult to efficiently collect the solid-phase High K material, e.g., Al, Hf, or Zr contained in the High K deposition precursor contained in the exhaust gas.

That is, in case that an aluminum oxide deposition precursor (trimethylaluminum (TMA)), a hafnium oxide deposition precursor (tetrakis (ethylmethylamido) hafnium (TEMAHf), and a zirconium oxide deposition precursor (Cp-Zr [cyclopentadienyl tris (dimethylamino) zirconium]), which are contained in the exhaust gas, are discharged, there occurs a problem in that it is difficult to efficiently collect the High K material deposited by an oxidation reaction, and the High K material may be discharged to the outside of the collection apparatus.

However, there is still no collection apparatus capable of collecting the High K material contained in the High K deposition precursor with high efficiency. Accordingly, there is a need for a solution to address the above-mentioned problems.

DOCUMENTS OF RELATED ART

Patent Documents (Patent Document 1) Korean Patent No. 10-1806480 (Jan. 10, 2018)

(Patent Document 2) Korean Patent No. 10-2154196 (Sep. 9, 2020)

(Patent Document 3) Korean Patent No. 10-2311930 (Oct. 13, 2021)

(Patent Document 4) Korean Patent No. 10-2228180 (Mar. 16, 2021)

SUMMARY

An object to be achieved by the present disclosure is to provide an apparatus for collecting reaction by-products, which is capable of collecting powdered oxides grown from High K materials by inducing an oxidation reaction in a box-shaped collection part having a low-temperature region formed by a cooling pad part after thermally decomposing the High K material at a high temperature of a heater in an inlet port of the collection apparatus when High K deposition precursors, which are supplied to a process chamber for an oxidation process for depositing a semiconductor dielectric film with the High K material having high permittivity in order to miniaturize a semiconductor circuit, are discharged together with exhaust gas.

Another object to be achieved by the present disclosure is to provide an apparatus for collecting reaction by-products, in which two or more box-shaped collection parts each including an inner collection plate part and an outer collection box configured to surround the inner collection plate part are provided, the box-shaped collection parts are horizontally disposed to be spaced apart from one another at predetermined intervals, and then a quadrangular planar cooling pad part is disposed in a space between outer peripheries of the box-shaped collection part spaced apart from each other so that a coolant is circulated and supplied, such that a low-temperature region is maximized, the low-temperature region thermally conducted to a collection box of the box-shaped collection part is uniformly provided in the collection plate part accommodated therein, High K materials are deposited and collected by the occurrence of a high-efficiency oxidation reaction, and then the High K materials are accumulated in the collection box.

Still another object to be achieved by the present disclosure is to provide an apparatus for collecting reaction by-products having a cooling pad part, in which three coolant storage pads are connected by connection pipes to form a uniform low-temperature region in two separated box-shaped collection parts, a horizontal obstruction plate and a plurality of vertical obstruction plates are installed in each of the coolant storage pads to form flow paths and uniformly circulate a coolant so that the introduced coolant is sequentially circulated and discharged and each of the coolant storage pads maintains and provides the uniform low-temperature region, and two opposite portions of the obstruction plate partially protrude to the outside of the coolant storage pad to fix the position of the obstruction plate, generate vortices of the flow of the exhaust gas flowing along the coolant storage pad, and delay the flow of the exhaust gas, thereby improving cooling efficiency.

Yet another object to be achieved by the present disclosure is to provide an apparatus for collecting reaction by-products, in which collection plates, which constitute a collection plate part installed in a collection box of a box-shaped collection part, are provided vertically in a multi-stage manner, holes formed in the collection plates at the respective stages have different sizes and shapes so that collected reaction by-products in the form of powdered oxides are not directly discharged downward but collected in a multi-stage manner and accumulated in the collection box as flow paths are changed while passing through the collection plates at the respective stages, and a mesh filter discharge port, which protrudes toward the inside of a housing, is provided above a lower discharge port of the housing so that a direct outflow of reaction by-products is minimized, and a solid-phase material to be introduced into a vacuum pump is removed in advance, thereby improving durability.

Still yet another object to be achieved by the present disclosure is to provide an apparatus for collecting reaction by-products, in which a vertical height of a diffuser of a heater part is relatively larger than that of a diffuser in the related number of diffusers arranged radially is art, and a total relatively smaller than that of the diffusers in the related art, such that initial agglomeration of exhaust gas is prevented, heating of a heater is minimized, high-temperature contact properties of the introduced exhaust gas are improved, and precursors are supplied in a state in which pyrolysis of the precursors is maximized, thereby increasing chemical reactivity in a box-shaped collection part.

Another further object to be achieved by the present disclosure is to provide an apparatus for collecting reaction by-products, in which an inward protruding length of each of inner wall collection plates provided in a multi-stage manner in a lower region of an inner wall of a housing is longer than that of each of inner wall collection plates provided in a multi-stage manner in an upper region of the inner wall of the housing, and a plurality of holes is formed in each of the inner wall collection plates, such that a flow of exhaust gas is smoothly maintained as a downward flow without stagnating.

According to another aspect of the present disclosure, an apparatus for collecting reaction by-products for semiconductor processes through pyrolysis in a high-temperature region and an oxidation reaction in a low-temperature region is configured to collect the reaction by-products by accommodating exhaust gas, which is discharged from a process chamber, in a housing while heating the exhaust gas with a heater part, and the apparatus includes: a first dispersion-collection part configured to collect reaction by-products while dispersing exhaust gas, which contains a High K material that is introduced into a gas inlet port of the housing and thermally decomposed by a heater part, to a lower box-shaped collection part; the box-shaped collection part including a collection box configured to accumulate collected powdered oxides while accommodating the introduced exhaust gas in an internal space, in which the low-temperature region is formed, and then discharging the exhaust gas, and a collection plate part installed in the collection box and having a plurality of collection plates spaced apart from one another in an upward/downward direction and provided in a multi-stage manner to grow a solid-phase High K material to the powdered oxide through the oxidation reaction in the low-temperature region and collect the powdered oxide; a cooling pad part configured to circulate a coolant, which is supplied from the outside, and discharge the coolant to maximize an area of the low-temperature region and provide the low-temperature region to the box-shaped collection part; and a second dispersion-collection part configured to collect the reaction by-products while dispersing downward the exhaust gas have passed through the box-shaped collection part.

In the exemplary embodiment, the box-shaped collection part may be provided as two or more box-shaped collection parts spaced apart from one another at predetermined intervals in a width direction, and the cooling pad part may be configured such that a first coolant storage pad, a second coolant storage pad, and a third coolant storage pad are connected to sequentially store and supply the coolant, and coolant storage pads are disposed one by one between the two box-shaped collection parts and at an outer side thereof.

In the exemplary embodiment, the collection box may have a quadrangular box structure made of a metallic material and having a plurality of inflow holes formed in an upper surface thereof, and a plurality of outflow holes formed in a lower surface thereof, and the collection box may be configured to form the uniform low-temperature region by a heat source provided by the cooling pad part, guide plates may be provided at two opposite ends of the upper surface of the collection box, formed to a lower surface of the first dispersion-collection part, and configured to collect the reaction by-products while guiding a flow of the exhaust gas toward the inflow hole, and a plurality of vertical plates may protrude laterally from one side surface and be configured to collect the reaction by-products from the exhaust gas flowing laterally.

In the exemplary embodiment, the collection plate part may have the plurality of collection plates provided on two opposite vertical supports, spaced apart from one another at the predetermined intervals in the upward/downward direction, and provided in a multi-stage manner, and the collection plates may be provided in a multi-stage manner and have a plurality of quadrangular holes or circular holes formed alternately, sizes of the quadrangular holes or circular holes may decrease toward the lower collection plates, and the number of quadrangular holes or circular holes may increase toward the lower collection plates.

In the exemplary embodiment, the cooling pad part may be configured such that a first coolant storage pad, a second coolant storage pad, and a third coolant storage pad are connected by connection pipes and sequentially store and supply the coolant, an internal space of the cooling pad part may be divided into an upper end layer and a lower end layer by a predetermined length by a horizontal obstruction plate to define flow paths through which the coolant sequentially flows, and a plurality of vertical obstruction plates may be installed in the upper end layer and the lower end layer and provided alternately at predetermined intervals in a staggered manner in the upward/downward direction so that the coolant flows along zigzag flow paths.

In the exemplary embodiment, the horizontal obstruction plate and the vertical obstruction plates may each have low-temperature vortex pieces made by extending a part of a lateral portion outward from the coolant storage pad at predetermined intervals to increase the occurrence of a vortex and the low-temperature region.

In the exemplary embodiment, the housing may have a plurality of inner wall collection plates provided along an inner wall of a quadrangular box shape in a multi-stage manner in the upward/downward direction, and the inner wall collection plates provided in a lower region in a multi-stage manner may protrude to be longer than the inner wall collection plates provided in an upper region and have a plurality of holes to generate a vortex and collect the reaction by-products, and the housing may have a mesh filter discharge port installed above a gas discharge port provided at one point of a lower plate such that the exhaust gas is introduced through a mesh filter provided around the mesh filter discharge port and then discharged to the gas discharge port.

In the exemplary embodiment, the coolant, which is supplied to the cooling pad part, circulated, and then discharged, may be introduced through a coolant inlet port installed on an upper plate of the housing, the coolant may be introduced into a first coolant storage pad of the cooling pad part connected to an upper cooling bar installed on an upper portion of an outer lateral surface of the housing, the coolant may be stored and circulated while sequentially flowing through a second coolant storage pad and a third coolant storage pad to provide the low-temperature region to the box-shaped collection part, the coolant may be discharged to a lower cooling bar provided on a lower portion of an outer surface of the housing connected to the third coolant storage pad and flows upward, and then the coolant may be supplied to a coolant flow path formed on the upper plate, cools the upper plate of the housing while circulating, and is discharged through a coolant discharge port.

In the exemplary embodiment, the heater part may include: a heater configured to increase chemical reactivity by thermally decomposing an oxidation process High K deposition precursor or oxide deposition precursor contained in the exhaust gas at a high temperature; and diffusers installed radially on an upper portion of the heater and configured to disperse the heated exhaust gas laterally while improving high-temperature contact properties, and the heater may thermally decompose the precursor by heating the exhaust gas to 100° C. to 330° C. when the precursor contained in the introduced exhaust gas is TMA, heating the exhaust gas to 300° C. or higher when the precursor is TEMAHf, and heating the exhaust gas to 200° C. or higher when the precursor is Cp-Zr.

In the exemplary embodiment, the first dispersion-collection part may include a quadrangular plate suspended on an upper plate of the housing, a plurality of quadrangular holes may be arranged in a region corresponding to a region of the box-shaped collection part positioned at the lower side, and a guide surface may be formed in the remaining region to guide a flow of the exhaust gas, which is dispersed laterally and flows along a wall surface of the housing, toward the quadrangular holes.

In the exemplary embodiment, the second dispersion-collection part may include a quadrangular plate having a region in which a plurality of quadrangular holes is arranged to guide the exhaust gas downward, and a region of a guide surface that guides the exhaust gas toward the quadrangular holes from the periphery, the quadrangular hole provided in a central portion may have a small opening area, and the opening area may increase toward a peripheral portion, and the quadrangular plates may be spaced apart from one another at predetermined intervals by spacing supports 133 installed on a lower plate and support loads of the box-shaped collection part and the cooling pad part.

In the exemplary embodiment, a plurality of vertical plates may be provided at two opposite sides of an upper surface of the quadrangular plate, faces one another in a diagonal direction, and protrude upward, and the plurality of vertical plates may be welded to lateral surfaces of the two collection boxes and configured to collect the reaction by-products contained in the exhaust gas flowing laterally, and a plurality of support plates may be provided at a plurality of points provided at one side of the upper surface of the quadrangular plate and configured to support loads of a first cooling pad, a second cooling pad, and a third cooling pad of the cooling pad part while spacing lower portions of the first cooling pad, the second cooling pad, and the third cooling pad at predetermined intervals.

In the exemplary embodiment, guide plates may be provided on a lower surface of the quadrangular plate, disposed between a plurality of arranged quadrangular holes, and protrude downward vertically to collect the reaction by-products while uniformly guiding a flow of the exhaust gas.

According to the apparatus for collecting reaction by-products according to the present disclosure characterized as described above, it is possible to collect only the solid-phase reaction by-products in the precursors contained in the exhaust gas by thermally decomposing the solid-phase High K material contained in the precursor by heating the solid-phase High K material with the heater in the inlet of the collection apparatus and then growing the solid-phase High K material by inducing the oxidation reaction in the low-temperature region by cooling the High K material to the temperature required to grow the High K material to the powdered oxide by using the cooling pad part while guiding the flow of the exhaust gas to the box-shaped collection part when the oxidation process High K deposition precursors, which are supplied to the process chamber in which the semiconductor is manufactured for the semiconductor insulation film process using the High K material having high permittivity to miniaturize the semiconductor circuit, are contained in the exhaust gas and discharged after the deposition process.

In addition, according to the present disclosure, the box-shaped collection part includes the inner collection plate part and the outer collection box configured to surround the inner collection plate part, the box-shaped collection parts are horizontally disposed to be spaced apart from one another at predetermined intervals, and then the quadrangular planar cooling pad part is disposed in the space between the outer peripheries of the box-shaped collection part spaced apart from each other so that the coolant is circulated and supplied, such that the low-temperature region is maximized, the low-temperature region thermally conducted to the collection box of the box-shaped collection part is uniformly provided in the collection plate part accommodated therein, and the High K materials are deposited and collected by the occurrence of the high-efficiency oxidation reaction.

In addition, according to the present disclosure, the three coolant storage pads are connected by the connection pipes to form the uniform low-temperature region in the two separated box-shaped collection parts, the horizontal obstruction plate and the plurality of vertical obstruction plates are installed in each of the coolant storage pads to form the flow paths and uniformly circulate the coolant by allowing the coolant to flow from one of the lower and upper end layers to the other of the lower and upper end layers in a zigzag manner and flow to any one of the layers in the adjacent coolant storage pad so that the introduced coolant is sequentially circulated and discharged and each of the coolant storage pads maintains and provides the uniform low-temperature region, and the two opposite portions of the obstruction plate partially protrude to the outside of the coolant storage pad to fix the position of the obstruction plate, generate the vortices of the flow of the exhaust gas flowing along the coolant storage pad, and delay the flow of the exhaust gas, thereby improving the cooling efficiency.

In addition, according to the present disclosure, the collection plates, which constitute the collection plate part installed in the collection box of the box-shaped collection part, are provided vertically in a multi-stage manner, the holes formed in the collection plates at the respective stages have different sizes and shapes so that the collected reaction by-products in the form of powdered oxides are not directly discharged downward but collected in a multi-stage manner and accumulated in the collection box as the flow paths are changed while passing through the collection plates at the respective stages, and the mesh filter discharge port, which protrudes toward the inside of the housing, is provided above the lower discharge port of the housing so that a direct outflow of the reaction by-products is minimized, and the solid-phase material to be introduced into the vacuum pump is removed in advance, thereby improving durability.

In addition, according to the present disclosure, the vertical height of the diffuser of the heater part is relatively larger than that of a diffuser in the related art, and a total number of diffusers arranged radially is relatively smaller than that of the diffusers in the related art, such that initial agglomeration of the exhaust gas is prevented, the high-temperature contact properties of the introduced exhaust gas are improved, and the precursors are supplied in a state in which pyrolysis of the precursors is maximized, thereby increasing chemical reactivity in the box-shaped collection part.

In addition, according to the present disclosure, the inward protruding length of each of the inner wall collection plates provided in a multi-stage manner in the lower region of the inner wall of the housing is longer than that of each of the inner wall collection plates provided in a multi-stage manner in the upper region of the inner wall of the housing, and the plurality of holes is formed in each of the inner wall collection plates, such that the flow of the exhaust gas is smoothly maintained as the downward flow without stagnating.

The present disclosure is a useful invention having many advantages as described above and is an invention that is highly expected to be used in industries.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, configurations and operations of embodiments of the present disclosure will be described in detail with reference to the accompanying drawings. In addition, in the description of the present disclosure, the specific descriptions of related well-known functions or configurations will be omitted when it is determined that the specific descriptions may unnecessarily obscure the subject matter of the present disclosure.

Figure 1:
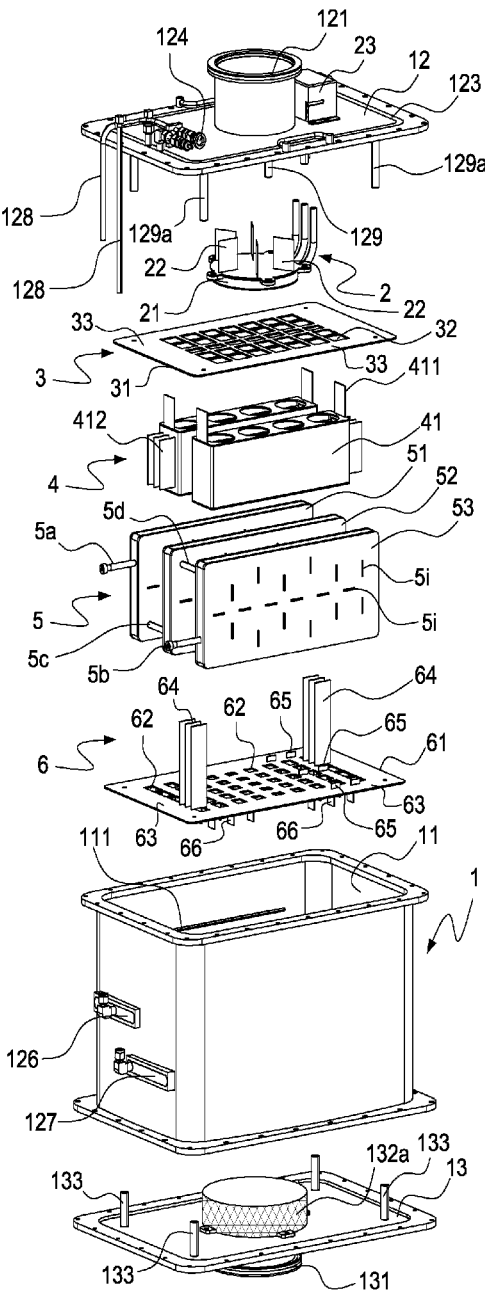
FIG. 1 is an exploded perspective view of an apparatus for collecting reaction by-products according to an embodiment of the present disclosure.
Figure 2:
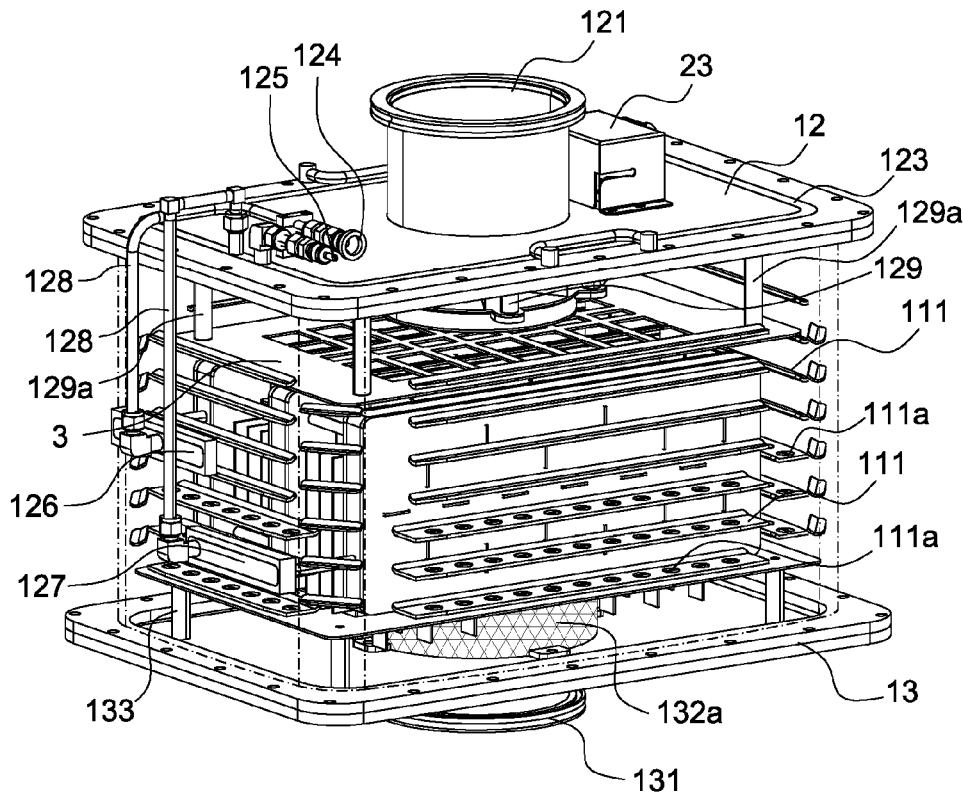
FIG. 2 is a perspective view illustrating an interior of the apparatus for collecting reaction by-products according to the embodiment of the present disclosure.
Figure 3:
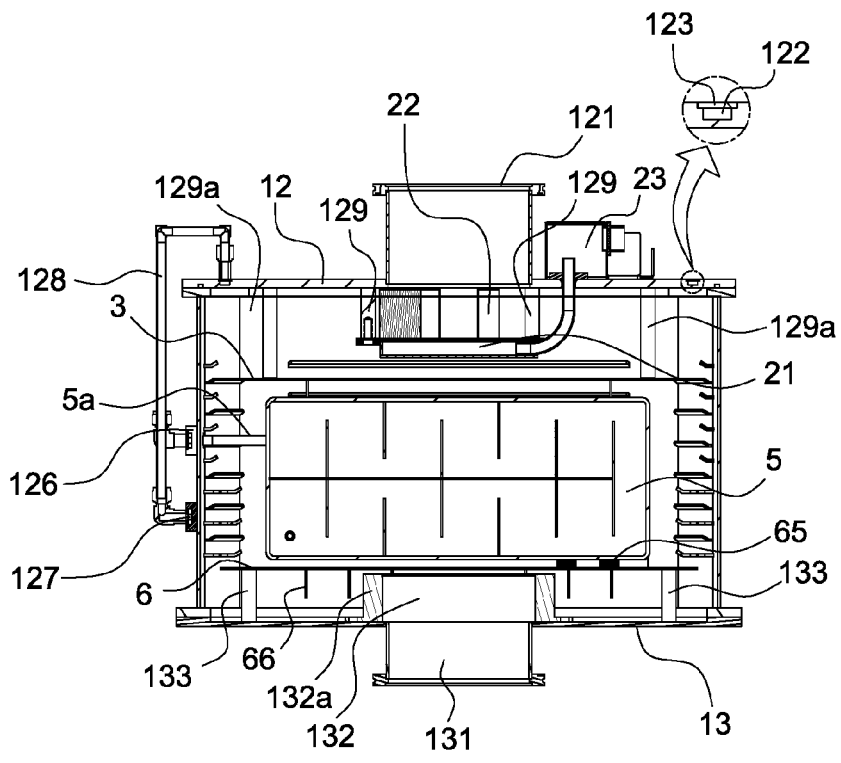
FIG. 3 is an exemplified cross-sectional view of the apparatus for collecting reaction by-products according to the embodiment of the present disclosure.
Figure 4:
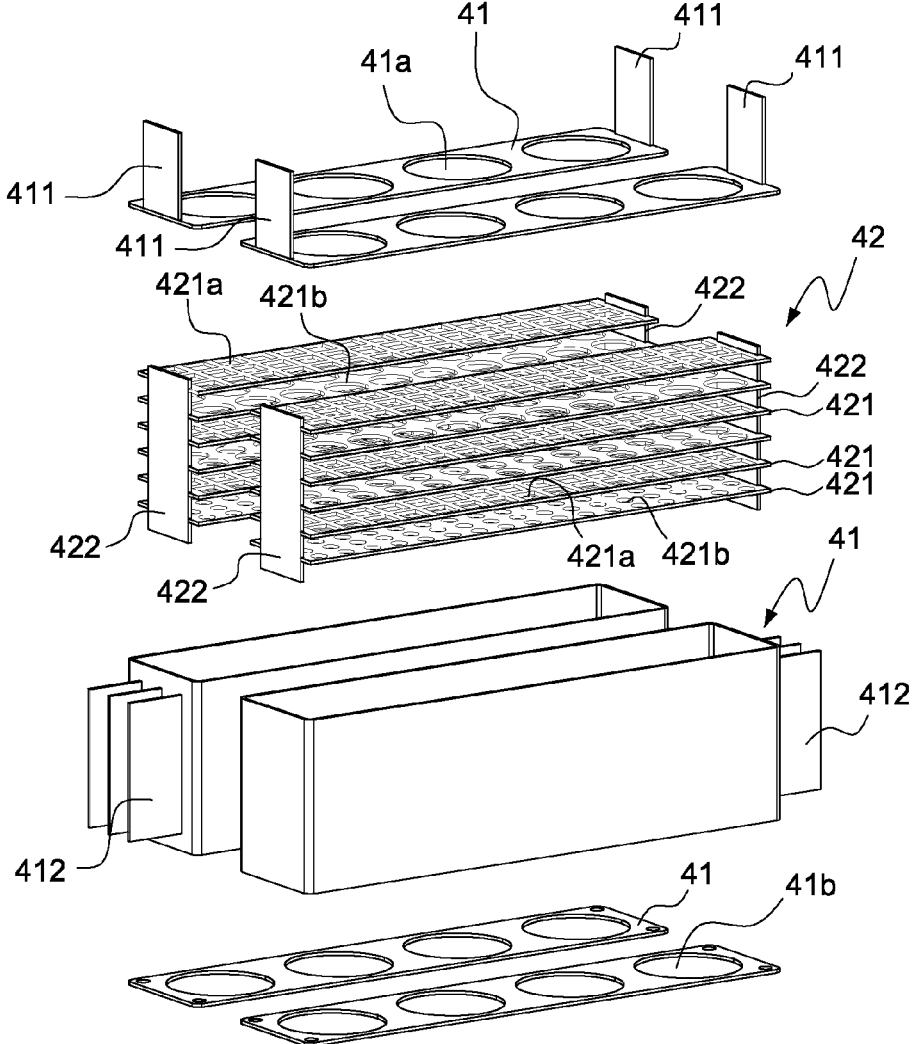
FIG. 4 is an exploded perspective view illustrating a structure of a box-shaped collection part according to the embodiment of the present disclosure.
Figure 5:
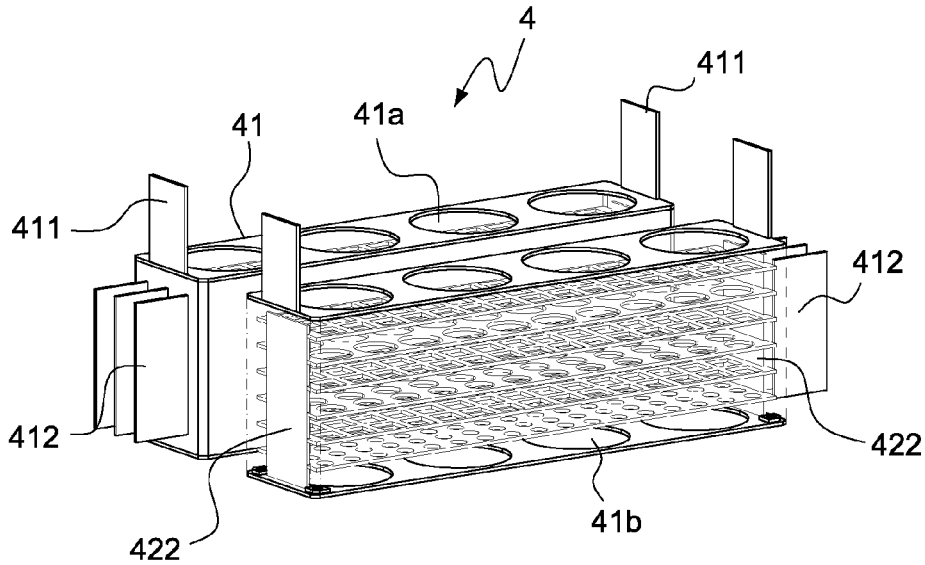
FIG. 5 is a perspective view illustrating a coupling structure of the box-shaped collection part according to the embodiment of the present disclosure.
Figure 6:
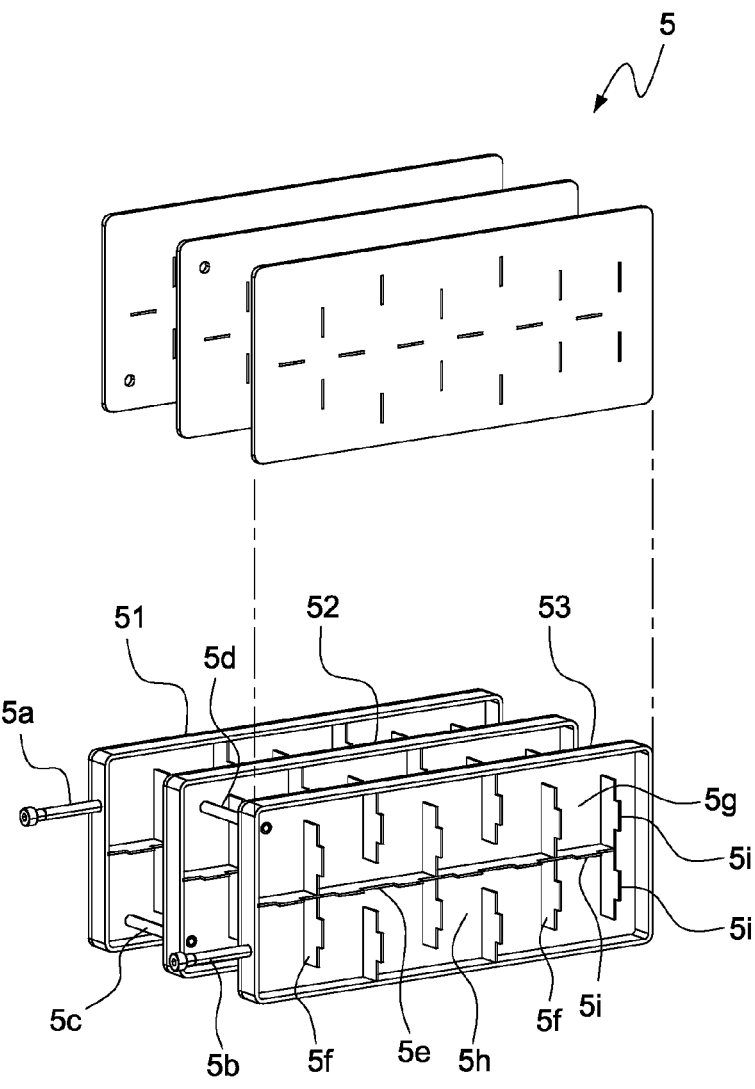
FIG. 6 is an exploded perspective view illustrating a structure of a cooling pad part according to the embodiment of the present disclosure.

FIG. 1 is an exploded perspective view of an apparatus for collecting reaction by-products according to an embodiment of the present disclosure, FIG. 2 is a perspective view illustrating an interior of the apparatus for collecting reaction by-products according to the embodiment of the present disclosure, FIG. 3 is an exemplified cross-sectional view of the apparatus for collecting reaction by-products according to the embodiment of the present disclosure, FIG. 4 is an exploded perspective view illustrating a structure of a box-shaped collection part according to the embodiment of the present disclosure, FIG. 5 is a perspective view illustrating a coupling structure of the box-shaped collection part according to the embodiment of the present disclosure, and FIG. 6 is an exploded perspective view illustrating a structure of a cooling pad part according to the embodiment of the present disclosure.

As illustrated, the collection apparatus according to the present disclosure is an apparatus for collecting reaction by-products that is installed on an exhaust line and disposed between a process chamber and a vacuum pump in order to collect only solid-phase reaction by-products in oxidation process High K deposition precursors contained in exhaust gas when the oxidation process High K deposition precursors, which are supplied to the process chamber in which semiconductors are being manufactured for a semiconductor dielectric film process by using a High K material having high permittivity to miniaturize a semiconductor circuit in the process chamber for producing the semiconductors, are discharged after the deposition process. The collection apparatus includes a housing 1, a heater part 2, a first dispersion-collection part 3, box-shaped collection parts 4, a cooling pad part 5, and a second dispersion-collection part 6.

The collection apparatus according to the present disclosure is manufactured by using a material such as titanium, stainless steel, or aluminum to prevent corrosion or the like caused by the exhaust gas discharged from the process chamber.

The housing 1 has an hollow quadrangular box shape. The housing 1 is configured to serve to store exhaust gas to collect powdered oxides through an oxidation reaction at a low temperature when the exhaust gas, which contains a High K material with chemical reactivity increased when a High K deposition precursor is thermally decomposed while passing through the heater part 2 positioned above the box-shaped collection part 4 installed in the housing 1, is introduced into the housing 1.

The housing is opened at an upper side thereof. The box-shaped collection part is accommodated and installed in the housing, the housing is covered by an upper plate, and then the box-shaped collection part is fixed by using bolts or other fastening means.

A plurality of inner wall collection plates 111 protrudes inward from an inner wall 11 of the housing and are disposed along the inner wall 11. The plurality of inner wall collection plates 111 is provided in a multi-stage manner and spaced apart from one another at predetermined intervals in an upward/downward direction.

In this case, the inner wall collection plates, which are provided in a multi-stage manner in a lower region of the inner wall of the housing and disposed below the inner wall collection plates provided in an upper region of the inner wall of the housing, are each longer in inward protruding length than each of the inner wall collection plates provided in the upper region and each have a plurality of holes 111a formed in a surface thereof, such that a downward flow of the exhaust gas is smoothly maintained without stagnating.

In case that the inner wall collection plates 111 are provided, the exhaust gas, which is introduced into the housing, generates vortices while colliding with the inner wall collection plates 111, such that the flow of the exhaust gas may stagnate, which may improve efficiency in collecting the reaction by-products.

An upper plate 12, which defines an upper portion of the housing, serves as a cover that covers the open upper side of the housing. The upper plate 12 has a gas inlet port 121 protruding upward so that the exhaust gas is introduced. The upper plate 12 is configured to receive the exhaust gas discharged from the process chamber (not illustrated).

In addition, a heater power supply part 23 is installed on the upper plate and configured to supply power to the heater part installed on a bottom surface of the upper plate. The heater power supply part 23 includes a temperature sensor configured to measure a temperature so that the power is controlled depending on the internal temperature.

In addition, a coolant flow path 122 is formed in an upper surface of the upper plate and processed in a groove shape in the upper surface of the upper plate in order to prevent the housing from being heated by an operation of a heater disposed in the housing and installed on the lower portion of the upper plate. An upper portion of the coolant flow path is configured to be blocked by a flow path cover 123. In this case, although not illustrated, the flow path cover may be fastened by sealing for liquid tightness, and fastening methods such as fitting, welding, and bolting may be applied.

The coolant flow path 122 is configured such that the coolant supplied from an external coolant tank (not illustrated) is introduced through a coolant inlet port 124 and then circulated and discharged through a coolant discharge port 125. The adjacent parts of the coolant flow path have a boundary portion without communicating with each other so that the introduced coolant and the coolant to be discharged are not mixed. Water or a refrigerant may be used as the coolant.

In this case, the coolant introduced through the coolant inlet port 124 does not flow directly along the coolant flow path 122. The coolant is supplied downward through a coolant pipe 128 and then introduced into a first coolant storage pad 51 of the cooling pad part 5 installed in the housing through an inflow pipe connected to an upper cooling bar 126 provided on an upper portion of an outer surface of the housing. Thereafter, the coolant provides a low-temperature region in the box-shaped collection part 4 while being stored and circulated and sequentially passing through a second coolant storage pad 52 and a third coolant storage pad 53. The coolant is discharged to a lower cooling bar 127 provided on a lower portion of the outer surface of the housing through a discharge pipe connected to the third coolant storage pad 53. The coolant flows upward through the coolant pipe 128 and is supplied to the coolant flow path 122 formed on the upper plate. The coolant cools the upper plate of the housing while circulating through the coolant flow path 122 and then is finally discharged through the coolant discharge port 125.

In addition, a plurality of heater cradles 129 is provided on a bottom surface of the upper plate and fixes the heater part 2 in a suspended manner.

In addition, a plurality of collection part cradles 129a is provided on the bottom surface of the upper plate and fixes the first dispersion-collection part 3 in a suspended manner. The collection part cradle 129a is longer in length than the heater cradle 129, such that the collection part cradle 129a is positioned below the heater part.

A lower plate 13, which defines a lower portion of the housing, has a gas discharge port 131 formed downward at one point, and the gas discharge port 131 is configured to be used as a passageway through which the exhaust gas, from which the reaction by-product is removed, is discharged. A mesh filter discharge port 132, which protrudes toward the inside of the housing, is provided above the lower discharge port, which minimizes a degree to which the reaction by-product directly flows outward and downward.

The mesh filter discharge port 132 has a cylindrical shape having a closed upper side and an opened lower side, and a mesh filter 132a is provided around the cylindrical shape. Even when the reaction by-product is present in the exhaust gas introduced from above, the reaction by-product flows along the flow of the exhaust gas flowing laterally without being discharged directly to the lower gas discharge port 131 formed on the lower plate because the upper side of the mesh filter discharge port 132 is closed, such that the reaction by-product is collected by the mesh filter provided around the mesh filter discharge port. Therefore, the degree to which the reaction by-product contained in the exhaust gas flows outward is minimized.

In addition, spacing supports 133 protrude upward from portions adjacent to vertices of an upper surface of the lower plate 13. At least four spacing supports 133 are fastened to a lower portion of the second dispersion-collection part 6 positioned above the spacing supports 133. The spacing supports 133 space the box-shaped collection part 4, the cooling pad part 5, and the second dispersion-collection part 6 at predetermined heights from the upper surface of the lower plate while supporting loads of the box-shaped collection part 4, the cooling pad part 5, and the second dispersion-collection part 6.

In addition, the spacing height ensures a space between the lower plate 13 and the second dispersion-collection part 6 in which the mesh filter discharge port 132 is positioned, such that the exhaust gas, which is dispersed by the second dispersion-collection part 6 and flows downward, is introduced into the mesh filter discharge port 132 laterally and then flows to the gas discharge port 131 protruding downward from the lower plate.

The heater part 2 includes a heater 21 configured to improve chemical reactivity by thermally decomposing, at a high temperature, an oxidation process High K deposition precursor or oxide deposition precursor contained in the exhaust gas introduced through the gas inlet port 121 provided on the upper plate of the housing, and diffusers 22 radially installed on an upper portion of the heater and configured to disperse the heated exhaust gas laterally.

The heater 21 and the diffusers 22 are fastened together by the plurality of heater cradles 129 provided on the lower portion of the upper plate, and the heater 21 and the diffusers 22 are installed and fixed to the lower portion of the upper plate in a suspended state.

When electric power is applied to a heat source of the heater by the heater power supply part 23 installed on the upper surface of the upper plate, the heat source heats the High K deposition precursor or oxide deposition precursor to a pyrolysis temperature of a material contained in the High K deposition precursor or oxide deposition precursor contained in the introduced exhaust gas, thereby improving the chemical reactivity.

For example, in one embodiment, in case that the precursor contained in the exhaust gas is trimethylaluminum (TMA) that is an aluminum oxide ($Al_2O_3$) deposition precursor, the heater is heated to a temperature of 100° C. to 330° C., i.e., the pyrolysis temperature, and the heat is supplied. In addition, in case that the precursor is tetrakis (ethylmethylamido) hafnium (TEMAHf) that is an oxidation hafnium ($HfO_2$) deposition precursor, the heater is heated to a temperature of 300° C. or higher, i.e., the pyrolysis temperature, and the heat is supplied. In addition, in case that the precursor is Cp-Zr [cyclopentadienyl tris (dimethylamino) zirconium] that is an oxidation zirconium ($ZrO_2$) deposition precursor, the heater is heated to a temperature of 200° C. or higher, i.e., the pyrolysis temperature, and the heat is supplied.

Meanwhile, the present disclosure may, of course, be applied to a process of collecting powdered oxides by inducing an oxidation reaction in a low-temperature region of the box-shaped collection part 4 by thermally decomposing solid-phase particles of the precursors contained in the exhaust gas by providing a heating temperature of the heater in order to supply a pyrolysis temperature suitable for the precursor used for a process of depositing other oxide materials other than the precursor using the High K material having high permittivity.

In addition, the present disclosure is configured such that a vertical height of the diffuser positioned on the upper portion of the heater part is relatively higher than that of a diffuser in the related art, and the number of diffusers arranged radially is relatively smaller than the number of diffusers in the related art.

In one embodiment, about five diffusers may be radially disposed to increase high-temperature contact properties with the introduced exhaust gas by the heat source thermally conducted by the heater. Because the number of diffusers decreases, a space of an introduction part, which is occupied by the diffusers, may be reduced, such that the introduction part is prevented from being clogged by the reaction by-product. A thermal loss of the heater heated at a high temperature may be minimized, and the damage to the heater may be minimized by improving the ease of cleaning the heater.

Therefore, the precursor contained in the exhaust gas is thermally decomposed maximally and supplied to the box-shaped collection part while having the increased chemical reactivity, such that the chemical reactivity, which changes the precursor to an oxide, increases, and the efficiency in collecting the solid-phase powdered oxides increases.

The first dispersion-collection part 3 disperses and supplies the exhaust gas, which contains the High K material thermally decomposed by passing through the heater part 2, to the box-shaped collection part 4 positioned at the lower side, such that the reaction by-products are uniformly collected.

The first dispersion-collection part 3 is fastened by the plurality of collection part cradles 129a provided on the lower portion of the upper plate of the housing is installed and fixed in a state of suspended on the lower portion of the upper plate. The collection part cradle 129a is longer in length than the heater cradle 129, such that the collection part cradle 129a is positioned below the heater part.

The first dispersion-collection part 3 is provided in the form of a quadrangular plate 31, like an internal space of the housing 1. A plurality of quadrangular holes 32 is formed and arranged in a plate region corresponding to a region in which the two box-shaped collection parts 4 are installed to be spaced apart from each other at a predetermined interval in a length direction and disposed below the first dispersion-collection part 3, such that the main flow of the exhaust gas is supplied to upper ends of the box-shaped collection parts 4.

To this end, the quadrangular plate 31 is provided adjacent to the inner wall of the housing 1. A region of a peripheral portion of the quadrangular plate 31, in which the quadrangular hole 32 is not formed, is formed as a guide surface 33. The exhaust gas, which is dispersed laterally by the diffusers 22 of the heater part 2 and mainly flows along the wall surface of the housing, flows toward a center along the guide surface 33 and then flows through the quadrangular holes 32 to the box-shaped collection parts 4 disposed below the quadrangular holes 32.

In addition, a part of the exhaust gas, which flows through an outer side of the quadrangular plate 31 provided adjacent to the inner wall of the housing, generates vortices by the inner wall collection plates 111 protruding from the inner wall of the housing and provided in a multi-stage manner, such that the vortices collect the reaction by-products while flowing toward the box-shaped collection part 4 or flowing downward.

The box-shaped collection part 4 includes a collection box 41 configured to accumulate the collected powdered oxides while accommodating the introduced exhaust gas in the internal space having the low-temperature region and then discharging the exhaust gas downward, and a collection plate part 42 having a plurality of collection plates 421 installed in a multi-stage manner in the upward/downward direction in the collection box 41 and configured to collect the powdered oxides made from the solid-phase High K materials in the low-temperature region by the oxidation reaction. In this case, the box-shaped collection parts 4 are configured as two or more box-shaped collection parts 4 spaced apart from one another at predetermined intervals in the width direction.

The reason why the two or more box-shaped collection parts 4 are provided as described above is to collect the solid-phase reaction by-products, which are thermally decomposed in the exhaust gas, with high efficiency by the plurality of box-shaped collection parts 4 by inducing and growing the oxidation reaction in the low-temperature region by cooling the High K materials to a temperature, which is required to grow the High K material to the powdered oxide, by providing the uniform low-temperature region to the peripheries of the box-shaped collection parts 4 in a state in which a plurality of cooling pad parts 5 is provided to each have a quadrangular surface having two opposite surfaces larger in height of the box-shaped collection part 4, and the plurality of cooling pad parts 5 is positioned between one side surface of one side box-shaped collection part 4, the other side surface of the other side box-shaped collection part 4, one side box-shaped collection part 4, and the other side box-shaped collection part 4.

If a single box-shaped collection part 4 having the same volume is provided without dividing the box-shaped collection part 4 into the two box-shaped collection parts 4, the High K material may be grown to the powdered oxide by inducing the oxidation reaction at the lateral portion on which the low-temperature region is provided by the cooling pad part 5. However, because an area in which the low-temperature region provided decreases, there occurs a problem in that a smooth oxidation reaction cannot be generated, a high-efficiency collection reaction cannot be achieved, and a collection space is wasted.

In one embodiment, the collection box 41 has a structure having a plurality of holes formed in upper and lower portions. The collection box 41 may have a quadrangular box structure having four inflow holes 41a formed in an upper surface thereof, and four outflow holes 41b formed in a lower surface thereof.

Therefore, the flow of the exhaust gas is defined such that the exhaust gas, which is introduced through the inflow hole from above, is accommodated in the collection box and then discharged only through the lower outflow holes.

The surfaces of the collection box 41, which exclude the inflow hole 41a and the outflow hole 41b, each have a quadrangular structure. The surfaces of the collection box 41 are each made of a metallic material having high thermal conduction efficiency, such that a low-temperature heat source provided by the cooling pad part 5 is thermally conducted quickly and defines the uniform low-temperature region.

Therefore, the collection plate part 42 installed in the collection box 41 provides the uniform low-temperature regions in the entire region, such that the oxidation reaction occurs, and the High K material contained in the introduced exhaust gas is grown to the powdered oxide.

Meanwhile, guide plates 411, which each have a width of a short side of the collection box 41, are formed at two opposite ends of the upper surface of the collection box 41 having a rectangular hexahedral shape and protrude upward to the lower surface of the first dispersion-collection part 3. The guide plates 411 are configured to guide the exhaust gas so that the exhaust gas, which is dispersed and supplied downward from the first dispersion-collection part 3, flows toward the upper inflow holes of the collection box 41 without being discharged to the outside.

In addition, a plurality of vertical plates 412, which each has a height slightly smaller than the vertical height of the collection box, is arranged on and protrudes laterally from one side surface of one of the two collection boxes 41. The plurality of vertical plates 412 is configured such that the High K materials contained in the exhaust gas, which flows downward laterally without flowing toward the upper inflow holes of the collection boxes 41, are grown to the powdered oxides by the oxidation reaction, and the powdered oxides are collected.

In addition, a plurality of vertical plates 412, which each has a height slightly smaller than the vertical height of the collection box, is arranged on and protrudes laterally from the other side surface of the other of the collection boxes 41. The plurality of vertical plates 412 is configured such that the High K materials contained in the exhaust gas, which flows downward laterally without flowing toward the upper inflow holes of the collection boxes 41, are grown to the powdered oxides by the oxidation reaction, and the powdered oxides are collected.

Meanwhile, in the case of the two collection boxes 41 each having the plurality of vertical plates 412 at one side thereof, a plurality of vertical plates of the second dispersion-collection part 6 is positioned and arranged on the remaining sides of the two collection boxes 41 at which the vertical plate 412 is not provided. The plurality of vertical plates of the second dispersion-collection part 6 protrudes laterally by a vertical height slightly equal to a height of each of the vertical plates 412 provided on one side surface and the other side surface of the two collection boxes. Therefore, the High K materials contained in the exhaust gas, which flows downward laterally without flowing to the upper inflow holes of the collection boxes 41, are grown to the powdered oxides by the oxidation reaction, and the powdered oxides are collected.

When the flow of the exhaust gas, which flows to the upper surface and the lateral portion of the collection box 41, is regulated as described above, the plurality of cooling pad parts 5, which each has a quadrangular surface larger in height than the box-shaped collection part 4, is positioned in a longitudinal space of the collection box and blocks the flow of the exhaust gas between one side surface of one side box-shaped collection part 4, the other side surface of the other side box-shaped collection part 4, and the box-shaped collection parts 4 spaced apart from each other, such that the exhaust gas is introduced into the upper inflow holes 41a of the collection boxes 41.

The plurality of collection plates 421 of the collection plate part 42 is installed on two opposite vertical supports 422 installed vertically in the box-shaped collection part 4, and the plurality of collection plates 421 is provided in a multi-stage manner and spaced apart from one another at predetermined intervals in the upward/downward direction.

The collection plates 421, which constitute the collection plate part 42, are installed in a multi-stage manner on the left and right vertical supports 422 by welding or fitting.

In addition, the vertical support 422 is installed on and fixed to a bottom surface of the box-shaped collection part 4 by welding or fitting. A height of the vertical support 422 only needs to allow the collection plates 421 to be installed to be spaced apart from one another at predetermined intervals in the upward/downward direction. Therefore, the height of the vertical support 422 may be slightly smaller than the height of the collection part 4.

The collection plate part 42, which has the collection plates 421 provided in a multi-stage manner as described above, collects the powdered oxides, which are made by the oxidation reaction of the solid-phase High K materials thermally decomposed and contained in the exhaust gas, when the introduced exhaust gas forms the low-temperature region in the box-shaped collection part 4 by the heat source thermally conducted from the cooling pad part 5.

In one embodiment, six collection plates 421 are provided. The collection plates 421 are provided alternately in a multi-stage manner so that quadrangular holes 421a are formed in the collection plate 421 positioned at an upper side, and circular holes 421b are formed in the collection plate 421 positioned at a lower side.

In addition, the quadrangular hole formed in the upper collection plate 421 is larger than the hole formed in the lower collection plate. The collection plates 421 are formed so that the sizes of the quadrangular holes gradually decrease, and the number of quadrangular holes gradually increases toward the lower collection plates.

Likewise, the circular hole formed in the upper collection plate 421 is larger than the hole formed in the lower collection plate. The collection plates 421 are formed in a multi-stage manner so that the sizes of the circular holes gradually decrease, and the number of circular holes increases toward the lower collection plates.

As described above, the shapes of the holes formed in the collection plates 421 provided in the upward/downward direction are alternately disposed so that the sizes of the holes decrease and the number of holes increases downward toward the lower collection plates, such that the introduced exhaust gas does not have the same shape and the same flow.

That is, if the same size and the same shape are repeated, the exhaust gas flows downward without the occurrence of loads that hinders the flow of the exhaust gas, and thus the collection reaction does not occur properly. In contrast, in the case of the configuration in which the holes have different shapes and different sizes, the sizes of the holes decrease toward the lower collection plates, and the number of holes increases toward the lower collection plates, the exhaust gas flows downward and is discharged while colliding with the collection plates 421 at the respective stages. Therefore, different flows of the exhaust gas are formed each time, vortices are generated by a difference in flow velocities, and the time for which the exhaust gas remains on the collection plates 421 increases. Therefore, the sufficient oxidation reaction occurs, the High K materials contained in the introduced exhaust gas are grown to the powdered oxides, and the powdered oxides are collected.

Because the holes of the upper collection plate part 42 are large, the collected oxides are accumulated on the lower collection plate 421 having the small hole. The internal space of the box-shaped collection part 4 is filled with the collected oxides as the number of collection reactions increases.

In addition, the exhaust gas, from which the solid-phase reaction by-products are removed, is discharged downward through the outflow holes 41b formed in the lower portion of the box-shaped collection part 4 and flows downward toward the second dispersion-collection part 6.

The cooling pad part 5 is configured to maximize an area of the low-temperature region and provide the low-temperature region to the box-shaped collection part 4. The cooling pad part 5 is provided between the two box-shaped collection parts 4 spaced apart from each other in the width direction and disposed at points adjacent to one side surface of one side box-shaped collection part 4 and the other side surface of the other side box-shaped collection part 4. The cooling pad part 5 is configured such that a first cooling pad 51, a second cooling pad 52, and a third cooling pad 53 are connected by connection pipes so that a coolant is sequentially supplied, and the uniform low-temperature region is provided toward the box-shaped collection part 4 by the thermal conduction.

Specifically, the cooling pad part 5 is configured such that the coolant is introduced through one side inflow pipe 5a and the upper cooling bar 126 installed on an outer lateral surface of the housing and then provides the low-temperature region to the box-shaped collection part 4 while circulating through the first cooling pad 51, the second cooling pad 52, and the third cooling pad 53. Thereafter, the coolant is discharged to the lower cooling bar 127 provided on a lower lateral surface of the housing through the other side discharge pipe 5b of the cooling pad part 5. Therefore, the cooling pad part 5 is configured to maximize the area of the low-temperature region and provide the low-temperature region.

Any one of the first coolant storage pad 51, the second coolant storage pad 52, and the third coolant storage pad 53 is disposed between the box-shaped collection parts 4 and positioned adjacent to the outer surface. Therefore, the spaces, which are spaced apart from each other and disposed between the first coolant storage pad 51 and the second coolant storage pad 52 and between the second coolant storage pad 52 and the third coolant storage pad 53, are connected by the connection pipes 5c and 5d that penetratively connect the first coolant storage pad 51, the second coolant storage pad 52, and the third coolant storage pad 53, such that the coolant sequentially circulates.

In this case, the connection pipe 5c, which connects the first coolant storage pad 51 and the second coolant storage pad 52, is positioned at a lower side.

In addition, the connection pipe 5d, which connects the second coolant storage pad 52 and the third coolant storage pad 53, is positioned at an upper side.

The reason why the above-mentioned configuration is made is that the inflow pipe 5a, which is connected to the first coolant storage pad 51 and supplies the coolant, provides a flow path through which the coolant flows downward after being introduced into the upper side of the first coolant storage pad 51 from above through the upper cooling bar 126 installed on one side surface of the housing. Because the coolant, which is introduced through the connection pipe 5c from below, flows upward after being introduced into the lower side of the second coolant storage pad 52, the coolant circulates from above to below the third coolant storage pad 53 through the connection pipe 5d installed at the upper side, and then the coolant is discharged to the lower cooling bar 127 provided on the lower lateral surface of the housing through the discharge pipe 5b connected at the lower side.

The coolant reservoirs, such as the first coolant storage pad 51, the second coolant storage pad 52, and the third coolant storage pad 53, are used as described above instead of a simple coolant supply pipe at the time of lowering the internal temperature of the housing by supplying the coolant to a temperature at which the oxidation reaction occurs, such that a coolant heat source is thermally conducted to the collection box 41 of the box-shaped collection part 4, the uniform low-temperature region is provided to the plurality of collection plates 421 installed in the collection box 41, and the powdered oxides made by the oxidation reaction of the solid-phase High K material in the exhaust gas are collected.

However, if the first coolant storage pad 51, the second coolant storage pad 52, and the third coolant storage pad 53 are merely structured to store only the coolant, a temperature difference may occur between a partial region of a coolant storage region and a coolant region in which the coolant stagnates without circulating, and in this case, a non-uniform low-temperature region is provided to the box-shaped collection part 4, and the collection efficiency may deteriorate. Therefore, according to the present disclosure, the structure is provided in which the introduced coolant sequentially circulates through the entire region without stagnating.

To this end, the first coolant storage pad 51, the second coolant storage pad 52, and the third coolant storage pad 53 each have a horizontal obstruction plate 5e that divides an interior of each of the first coolant storage pad 51, the second coolant storage pad 52, and the third coolant storage pad 53 into upper and lower end layers by a predetermined length. The horizontal obstruction plate 5e divides the flow path in the internal space of each of the coolant storage pads into an upper end layer 5g and a lower end layer 5h so that the introduced coolant sequentially flows toward the other end.

In this case, only one end of the horizontal obstruction plate 5e adjoins and is fixed to the first coolant storage pad 51, the second coolant storage pad 52, and the third coolant storage pad 53, and the other end of the horizontal obstruction plate 5e is opened without being connected, such that the flow path between the upper end layer and the lower end layer is connected at the corresponding point.

In addition, a plurality of vertical obstruction plates 5f is respectively installed in the upper end layer 5g and the lower end layer 5h separated by the horizontal obstruction plate 5e. The plurality of vertical obstruction plates 5f is arranged at predetermined intervals and installed to face the flow of the coolant in the flow path.

In this case, at the installation positions of the vertical obstruction plates 5f, the vertical obstruction plates 5f are alternately installed in a staggered manner in the upward/downward direction so that the vertical obstruction plate 5f has one end adjoining the horizontal obstruction plate 5e and the other end opened, or the vertical obstruction plate 5f has one end adjoining a rim surface of the coolant storage pad and the other end opened.

Therefore, in one embodiment, the coolant introduced into the first coolant storage pad 51 is introduced first into the upper end layer 5g in the internal space defined by the horizontal obstruction plate 5e and then flows along a zigzag flow path defined by the plurality of vertical obstruction plates 5f installed alternately in a staggered manner. The coolant is introduced into the lower end layer 5h at the lower side from the end of the horizontal obstruction plate 5e and then flows again along the zigzag flow path defined by the plurality of vertical obstruction plates 5f. The coolant is introduced into the lower end layer of the adjacent second coolant storage pad 52 through the connection pipe 5c and then flows along the zigzag flow path to the upper end layer. The coolant is introduced again into the upper end layer of the adjacent third coolant storage pad 53 through the connection pipe 5d, flows along the zigzag flow path to the lower end layer, and then is discharged through the discharge pipe 5b.

Meanwhile, the horizontal obstruction plate 5e and the vertical obstruction plate 5f each have a plurality of low-temperature vortex pieces 5i made by extending a part of a lateral portion outward from the coolant storage pad at predetermined intervals. The plurality of low-temperature vortex pieces 5i fixes the positions of the horizontal obstruction plate 5e and the vertical obstruction plate 5f and generates vortices of the flow of the exhaust gas flowing along the outside of the coolant storage pads, such that the exhaust gas stagnates, the heat source of the coolant is thermally conducted, and the low-temperature region is increased.

To this end, the coolant storage pad has through-grooves (not illustrated) formed at protruding positions of the low-temperature vortex pieces 5i, such that the low-temperature vortex pieces 5i may be fitted with the through-grooves. Of course, welding and watertightness treatment may be performed on the protruding portions of the low-temperature vortex pieces to prevent a leak of the coolant at the time of manufacturing the coolant storage pad.

The second dispersion-collection part 6 is fastened to the spacing supports 133 installed on the portions adjacent to the vertices of the upper surface of the lower plate 13. The second dispersion-collection part 6 is configured to collect the reaction by-products while dispersing the exhaust gas, which has passed through the box-shaped collection part 4, toward the lower plate 13 positioned at the lower side in the state in which the second dispersion-collection part 6 is spaced apart from the lower plate at a predetermined interval.

In addition, the second dispersion-collection part 6 is configured to space, at a predetermined interval, the cooling pad part 5 and the box-shaped collection part 4 positioned at the upper side and support a load of the cooling pad part 5 and the box-shaped collection part 4.

Specifically, like the internal space of the housing 1, the second dispersion-collection part 6 includes a quadrangular plate 61, and a plurality of quadrangular holes 62 is formed and arranged to disperse the exhaust gas. The quadrangular hole formed in a central portion has a small opening area, and the opening areas increase toward a peripheral portion, such that the exhaust gas, which flows downward, mainly flows on the peripheral surface.

In addition, the quadrangular plate 61 is provided adjacent to the inner wall of the housing 1. A peripheral portion of the quadrangular plate 61 is formed as a guide surface 63 in which the quadrangular hole 62 is not formed. Therefore, the exhaust gas, which flows to the lateral surface of the upper box-shaped collection part 4 and flows along the wall surface of the housing, flows toward the center along the guide surface 63, meets the quadrangular hole 62, and then flows downward.

In addition, a plurality of vertical plates 64 is provided at two opposite sides of an upper surface of the quadrangular plate 61 so as to face one another in a diagonal direction and protrudes upward. The plurality of vertical plates 64 is welded to the lateral surface of the two collection boxes 41 on which the vertical plate 412 is not provided. The plurality of vertical plates 64 is configured to support a load and configured such that the High K materials contained in the exhaust gas, which flows downward laterally without flowing toward the upper inflow holes of the collection boxes 41, are grown to the powdered oxides by the oxidation reaction, and the powdered oxides are collected. A height of the vertical plate 64 is similar to a vertical height of each of the vertical plates 412 provided on one side surface and the other side surface of the collection box. The plurality of vertical plates 64 are arranged to protrude laterally.

In addition, a plurality of support plates 65 is provided at a plurality of points at one side of the upper surface of the quadrangular plate 61 and configured to support a load while spacing the lower portions of the first cooling pad 51, the second cooling pad 52, and the third cooling pad 53 of the cooling pad part 5 at predetermined intervals.

In addition, guide plates 66 are provided on the lower surface of the quadrangular plate 61 and disposed between the plurality of arranged quadrangular holes 62. The guide plates 66 protrude downward vertically. The plurality of arranged guide plates 66 collects the reaction by-products while guiding the exhaust gas so that the exhaust gas, which flows downward through the quadrangular holes 62, stably flows downward toward the lower plate through the distributed quadrangular holes without being dispersed to the periphery. In this case, the guide plate 66 is not installed at the side at which the mesh filter discharge port 132 is installed because there is no space in which the guide plate 66 protrudes.

In addition, a part of the exhaust gas, which flows through an outer side of the quadrangular plate 61 provided adjacent to the inner wall of the housing, generates vortices by the inner wall collection plates 111 protruding from the inner wall of the housing and provided in a multi-stage manner, such that the vortices collect the reaction by-products while flowing toward the second dispersion-collection part 6 or flowing downward.

With the second dispersion-collection part 6 having the above-mentioned structure, the exhaust gas, which is dispersed downward and flows downward toward the central portion, is dispersed laterally toward the inner wall of the housing without flowing downward by being blocked by the mesh filter discharge port 132 that blocks the upper portion of the gas discharge port 131 to prevent the exhaust gas from flowing outward directly into the gas discharge port 131 provided at the central portion of the lower plate. The reaction by-products, which are not collected, are finally collected and filtered out by the mesh filter provided around the lateral side of the mesh filter discharge port 132, and then the reaction by-products are discharged to the gas discharge port 131. If the exhaust gas flows outward directly into the gas discharge port 131 without the mesh filter discharge port 132, the reaction by-products contained in the exhaust gas may cause a breakdown such as a leak of the exhaust gas toward the vacuum pump.

An operation of the present disclosure configured as described above will be described below.

When the oxidation process High K deposition precursor, which is supplied into the process chamber in which semiconductors are manufactured for a semiconductor dielectric film process by using the High K material having high permittivity in order to miniaturize the semiconductor circuit, is contained in the exhaust gas and introduced through the gas inlet port 121 of the housing 1 of the collection apparatus after the deposition process, the heater 21 of the heater part 2 increases the chemical reactivity by thermally decomposing the oxidation process High K deposition precursor contained in the exhaust gas at a preset high temperature on the basis of properties of the High K material contained in the precursor.

Thereafter, the diffusers 22 radially installed on the upper portion of the heater disperse the heated exhaust gas laterally while improving the high-temperature contact properties.

Thereafter, the first dispersion-collection part 3 disperses and uniformly supplies the flow of the exhaust gas, in which the solid-phase High K materials contained in the precursors are thermally decomposed, upward toward the two box-shaped collection parts 4 positioned at the lower side.

In this case, the coolant, which is supplied from the outside by the first cooling pad 51, the second cooling pad 52, and the third cooling pad 53 that constitute the quadrangular planar cooling pad part 5, is stored in the space between the outer peripheries of the two box-shaped collection parts 4 spaced apart from each other and sequentially flows, such that the low-temperature region suitable for a temperature required to grow the High K material to the powdered oxide, is provided in the collection box 41 of the box-shaped collection part 4. Further, the coolant heat source is thermally conducted, such that the uniform low-temperature region is provided to the plurality of collection plates 421 installed in the collection box 41.

When the exhaust gas is introduced into the collection box in the state in which the heat is conducted to the collection box 41 of the box-shaped collection part in which the low-temperature region is provided, the exhaust gas flows along the collection plate part 42 having the plurality of collection plates 421 installed in a multi-stage manner in the collection box, and the exhaust gas flows along the flow paths having different sizes and shapes of the holes formed in the collection plates at the respective stages, such that the powdered oxides made by the oxidation reaction of the solid-phase High K materials contained in the exhaust gas are collected and accumulated and stored therein.

Thereafter, after the powdered oxides made by the oxidation reaction of the solid-phase High K materials are collected, the exhaust gas is not discharged directly to the lower discharge port. The second dispersion-collection part 6 collects the reaction by-products while dispersing the exhaust gas, which has passed through the box-shaped collection part 4, toward the lower plate 13 positioned at the lower side.

Thereafter, the dispersed exhaust gas is introduced laterally through the mesh filter discharge port disposed above the lower discharge port of the housing and protruding toward the inside of the housing, thereby finally discharging the reaction by-product to the gas discharge port 131 while minimizing the outflow of the reaction by-product.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. An apparatus for collecting reaction by-products for semiconductor processes through pyrolysis in a high-temperature region and an oxidation reaction in a low-temperature region, the apparatus being configured to collect the reaction by-products by accommodating exhaust gas, which is discharged from a process chamber, in a housing (1) while heating the exhaust gas with a heater part (2), and the apparatus comprising:

a first dispersion-collection part (3) configured to collect reaction by-products while dispersing exhaust gas, which contains a High K material that is introduced into a gas inlet port (121) of the housing (1) and thermally decomposed by a heater part (2), to a lower box-shaped collection part;

the box-shaped collection part (4) including a collection box (41) configured to accumulate collected powdered oxides while accommodating the introduced exhaust gas in an internal space, in which the low-temperature region is formed, and then discharging the exhaust gas, and a collection plate part (42) installed in the collection box (41) and having a plurality of collection plates (421) spaced apart from one another in an upward/downward direction and provided in a multi-stage manner to grow a solid-phase High K material to the powdered oxide through the oxidation reaction in the low-temperature region and collect the powdered oxide;

a cooling pad part (5) configured to circulate a coolant, which is supplied from the outside, and discharge the coolant to maximize an area of the low-temperature region and provide the low-temperature region to the box-shaped collection part (4); and a second dispersion-collection part (6) configured to collect the reaction by-products while dispersing downward the exhaust gas have passed through the box-shaped collection part (4).

2. The apparatus of claim 1, wherein the box-shaped collection part (4) is provided as two or more box-shaped collection parts spaced apart from one another at predetermined intervals in a width direction, and wherein the cooling pad part (5) is configured such that a first coolant storage pad (51), a second coolant storage pad (52), and a third coolant storage pad (53) are connected to sequentially store and supply the coolant, and coolant storage pads are disposed one by one between the two box-shaped collection parts (4) and at an outer side thereof.

3. The apparatus of claim 2, wherein the cooling pad part (5) is configured such that a first coolant storage pad (51), a second coolant storage pad (52), and a third coolant storage pad (53) are connected by connection pipes and sequentially store and supply the coolant, wherein an internal space of the cooling pad part (5) is divided into an upper end layer (5g) and a lower end layer (5h) by a predetermined length by a horizontal obstruction plate (5e) to define flow paths through which the coolant sequentially flows, and wherein a plurality of vertical obstruction plates (5f) is installed in the upper end layer (5g) and the lower end layer (5h) and provided alternately at predetermined intervals in a staggered manner in the upward/downward direction so that the coolant flows along zigzag flow paths.

4. The apparatus of claim 3, wherein the horizontal obstruction plate (5e) and the vertical obstruction plates (5f) each have low-temperature vortex pieces (5i) made by extending a part of a lateral portion outward from the coolant storage pad at predetermined intervals to increase the occurrence of a vortex and the low-temperature region.

5. The apparatus of claim 1, wherein the collection box (41) has a quadrangular box structure made of a metallic material and having a plurality of inflow holes (41a) formed in an upper surface thereof, and a plurality of outflow holes (41b) formed in a lower surface thereof, and the collection box (41) is configured to form the uniform low-temperature region by a heat source provided by the cooling pad part (5), wherein guide plates (411) are provided at two opposite ends of the upper surface of the collection box (41), formed to a lower surface of the first dispersion-collection part (3), and configured to collect the reaction by-products while guiding a flow of the exhaust gas toward the inflow hole, and wherein a plurality of vertical plates (412) protrudes laterally from one side surface and is configured to collect the reaction by-products from the exhaust gas flowing laterally.

6. The apparatus of claim 1, wherein the collection plate part (42) has the plurality of collection plates (421) provided on two opposite vertical supports (422), spaced apart from one another at the predetermined intervals in the upward/downward direction, and provided in a multi-stage manner, and wherein the collection plates (421) are provided in a multi-stage manner and have a plurality of quadrangular holes or circular holes formed alternately, sizes of the quadrangular holes or circular holes decrease toward the lower collection plates, and the number of quadrangular holes or circular holes increases toward the lower collection plates.

7. The apparatus of claim 1, wherein the housing (1) has a plurality of inner wall collection plates (111) provided along an inner wall (11) of a quadrangular box shape in a multi-stage manner in the upward/downward direction, and the inner wall collection plates provided in a lower region in a multi-stage manner protrude to be longer than the inner wall collection plates provided in an upper region and have a plurality of holes (111a) to generate a vortex and collect the reaction by-products, and wherein the housing (1) has a mesh filter discharge port (132) installed above a gas discharge port (131) provided at one point of a lower plate (13) such that the exhaust gas is introduced through a mesh filter (132a) provided around the mesh filter discharge port (132) and then discharged to the gas discharge port (131).

8. The apparatus of claim 1, wherein the coolant, which is supplied to the cooling pad part (5), circulated, and then discharged, is introduced through a coolant inlet port (124) installed on an upper plate (12) of the housing, the coolant is introduced into a first coolant storage pad (51) of the cooling pad part (5) connected to an upper cooling bar (126) installed on an upper portion of an outer lateral surface of the housing, the coolant is stored and circulated while sequentially flowing through a second coolant storage pad (52) and a third coolant storage pad (53) to provide the low-temperature region to the box-shaped collection part (4), the coolant is discharged to a lower cooling bar (127) provided on a lower portion of an outer surface of the housing connected to the third coolant storage pad (53) and flows upward, and then the coolant is supplied to a coolant flow path (122) formed on the upper plate, cools the upper plate of the housing while circulating, and is discharged through a coolant discharge port (125).

9. The apparatus of claim 1, wherein the heater part (2) comprises:

a heater (21) configured to increase chemical reactivity by thermally decomposing an oxidation process High K deposition precursor or oxide deposition precursor contained in the exhaust gas at a high temperature; and diffusers (22) installed radially on an upper portion of the heater and configured to disperse the heated exhaust gas laterally while improving high-temperature contact properties, and wherein the heater (21) thermally decomposes the precursor by heating the exhaust gas to 100° C. to 330° C. when the precursor contained in the introduced exhaust gas is TMA, heating the exhaust gas to 300° C. or higher when the precursor is TEMAHf, and heating the exhaust gas to 200° C. or higher when the precursor is Cp-Zr.

10. The apparatus of claim 1, wherein the first dispersion-collection part (3) includes a quadrangular plate (31) suspended on an upper plate of the housing, a plurality of quadrangular holes (32) is arranged in a region corresponding to a region of the box-shaped collection part (4) positioned at the lower side, and a guide surface (33) is formed in the remaining region to guide a flow of the exhaust gas, which is dispersed laterally and flows along a wall surface of the housing, toward the quadrangular holes (32).

11. The apparatus of claim 1, wherein the second dispersion-collection part (6) includes a quadrangular plate (61) having a region in which a plurality of quadrangular holes (62) is arranged to guide the exhaust gas downward, and a region of a guide surface (63) that guides the exhaust gas toward the quadrangular holes (62) from the periphery, wherein the quadrangular hole (62) provided in a central portion has a small opening area, and the opening area increases toward a peripheral portion, and wherein the quadrangular plates (61) are spaced apart from one another at predetermined intervals by spacing supports 133 installed on a lower plate and support loads of the box-shaped collection part (4) and the cooling pad part (5).

12. The apparatus of claim 11, wherein a plurality of vertical plates (64) is provided at two opposite sides of an upper surface of the quadrangular plate (61), faces one another in a diagonal direction, and protrudes upward, and the plurality of vertical plates (64) is welded to lateral surfaces of the two collection boxes (41) and configured to collect the reaction by-products contained in the exhaust gas flowing laterally, and wherein a plurality of support plates (65) is provided at a plurality of points provided at one side of the upper surface of the quadrangular plate (61) and configured to support loads of a first cooling pad (51), a second cooling pad (52), and a third cooling pad (53) of the cooling pad part (5) while spacing lower portions of the first cooling pad (51), the second cooling pad (52), and the third cooling pad (53) at predetermined intervals.

13. The apparatus of claim 11, wherein guide plates (66) are provided on a lower surface of the quadrangular plate (61), disposed between a plurality of arranged quadrangular holes (62), and protrude downward vertically to collect the reaction by-products while uniformly guiding a flow of the exhaust gas.

\* \* \* \* \*